United States Patent
Andreev

(10) Patent No.: US 7,656,325 B1
(45) Date of Patent: Feb. 2, 2010

(54) SERIALIZER-DESERIALIZER (SERDES) HAVING A PREDOMINANTLY DIGITAL ARCHITECTURE AND METHOD OF DESERIALIZING DATA

(75) Inventor: Alexander E. Andreev, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 8 days.

(21) Appl. No.: 12/169,696

(22) Filed: Jul. 9, 2008

(51) Int. Cl.
*H03M 9/00* (2006.01)

(52) U.S. Cl. ......................... 341/100; 375/258; 370/219

(58) Field of Classification Search ......... 341/100–101; 375/258, 219, 224; 370/463, 479, 360, 445, 370/219
See application file for complete search history.

(56) References Cited

U.S. PATENT DOCUMENTS

| | | | |
|---|---|---|---|
| 6,031,473 A * | 2/2000 | Kubinec | 341/100 |
| 6,341,142 B2 * | 1/2002 | Ducaroir et al. | 375/219 |
| 6,525,571 B2 * | 2/2003 | Green | 326/115 |
| 7,064,690 B2 * | 6/2006 | Fowler et al. | 341/101 |
| 7,362,797 B2 * | 4/2008 | Chan et al. | 375/219 |
| 7,486,721 B2 * | 2/2009 | Chan et al. | 375/219 |

* cited by examiner

*Primary Examiner*—Lam T Mai

(57) ABSTRACT

A serializer-deserializer and a method of deserializing data. In one embodiment, the serializer-deserializer includes: (1) an analog-to-digital converter configured to receive a serial data stream and provide a digital output based thereon, (2) a digital comparator coupled to the analog-to-digital converter and configured to compare the digital output to an output table to yield candidate output bits, (3) a digital feedback equalizer coupled to the digital comparator and configured to generate the output table based on the candidate output bits and (4) a multiplexer coupled to the digital comparator and configured to select output bits from among the candidate output bits to form a discrete bit sequence.

19 Claims, 2 Drawing Sheets

SERIALIZER-DESERIALIZER (SERDES) HAVING A PREDOMINANTLY DIGITAL ARCHITECTURE AND METHOD OF DESERIALIZING DATA

TECHNICAL FIELD

The invention is directed, in general, to a serializer-deserializer (SerDes) and, more specifically, to a SerDes having a predominantly digital architecture and a method of deserializing data.

BACKGROUND

As technology continues to advance at an unprecedented rate, the transfer of information ("data") has remained a high priority. In addition, as processing speeds continue to increase, the speed at which information is transferred remains key in increasing overall system speed. Traditionally, parallel busses or cables have been coupled between multiple devices to transfer information during a processing function. However, problems that may degrade the data transferred, such as signal loss when transmitted over long distances, have led to improvements in the manner in which such data is transferred. In addition, the multitude of wires or cables necessary for parallel connection may become cumbersome, especially in larger systems. In the past, however, alternatives to parallel connections often led to information bottlenecks, leaving parallel lines as the only viable choice.

As the need for bandwidth expands in the various networks now existing, or even those later developed, serial busses have become the ideal alternative for solving these problems. Typically, serial busses employ a serializer at a transmitting end to convert and transmit data in serial order and a deserializer at a receiving end to convert the data back to parallel form once received. Such serializer/deserializer ("SerDes") receivers have become the benchmark for asynchronous communication and have provided clear advantages over parallel busses. For example, SerDes receivers include transmitters and receivers, and use simplified wiring harnesses (often only a single wire per channel) that typically consume less power than their parallel-coupled counterparts. Higher performance may also be achieved because SerDes receivers reduce the crosstalk that often occurs between parallel wires. In addition, SerDes receivers may be employed to transmit data over long distances without the signal degradation experienced with parallel busses ultimately offering increased reliability and fidelity over parallel busses.

Although a tremendous improvement over parallel busses, serial connections employing SerDes receivers are not without problems. Since a separate clock signal for component and signal synchronizing is not used (typical of asynchronous communication), the receiving and transmitting ends of a SerDes are synchronized by monitoring the transmitted data. Within a conventional serial bus, each line of communication includes a separate SerDes transceiver, each having a SerDes receiver and transmitter, for serializing and deserializing each frame of data. As a result, each SerDes receiver includes its own phase-locked loop (PLL) circuit, each typically employing a voltage controlled oscillator (VCO) to generate the clock at the receiving end of the data transmission and to synchronize the clock with the timing of the data signal at the transmitting end. Without this synchronization, the data transmitted would likely be corrupted or lost.

SUMMARY

To address the above-discussed deficiencies of the prior art, one aspect of the invention provides a SerDes. In one embodiment, the SerDes includes: (1) an analog-to-digital converter (ADC) configured to receive a serial data stream and provide a digital output based thereon, (2) a digital comparator coupled to the ADC and configured to compare the digital output to an output table to yield candidate output bits, (3) a digital feedback equalizer (DFE) coupled to the digital comparator and configured to generate the output table based on the candidate output bits and (4) a multiplexer coupled to the digital comparator and configured to select output bits from among the candidate output bits to form a discrete bit sequence.

In another embodiment, the SerDes includes: (1) an ADC configured to receive a serial data stream and provide a digital output based thereon and including: (1a) an analog comparator matrix configured to compare a voltage of the serial data stream to various analog reference voltages, (1b) a deserializer coupled to the analog comparator matrix and configured to deserialize an output thereof and (1c) a compactor coupled to the deserializer and configured to compact an output thereof, (2) a digital comparator pipelined with the ADC and configured to compare the digital output to an output table to yield candidate output bits, (3) a DFE coupled to the digital comparator and configured to generate the output table based on the candidate output bits and (4) a multiplexer pipelined with the digital comparator and configured to select output bits from among the candidate output bits to form a discrete bit sequence.

Another aspect of the invention provides a method of deserializing data. In one embodiment, the method includes: (1) providing a digital output based on a received serial data stream, (2) employing a digital comparator to compare the digital output to an output table to yield candidate output bits, (3) employing a DFE to generate the output table based on the candidate output bits and (4) selecting output bits from among the candidate output bits to form a discrete bit sequence.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION OF CERTAIN ASPECTS AND EMBODIMENTS

Describe herein are various embodiments of a novel architecture for a SerDes, i.e., a circuit that transforms serial continuous data stream to a sequence of discrete bits. The novel architecture is mostly digital. The SerDes is formed of stages that operate sequentially, one after another.

Figure 1:
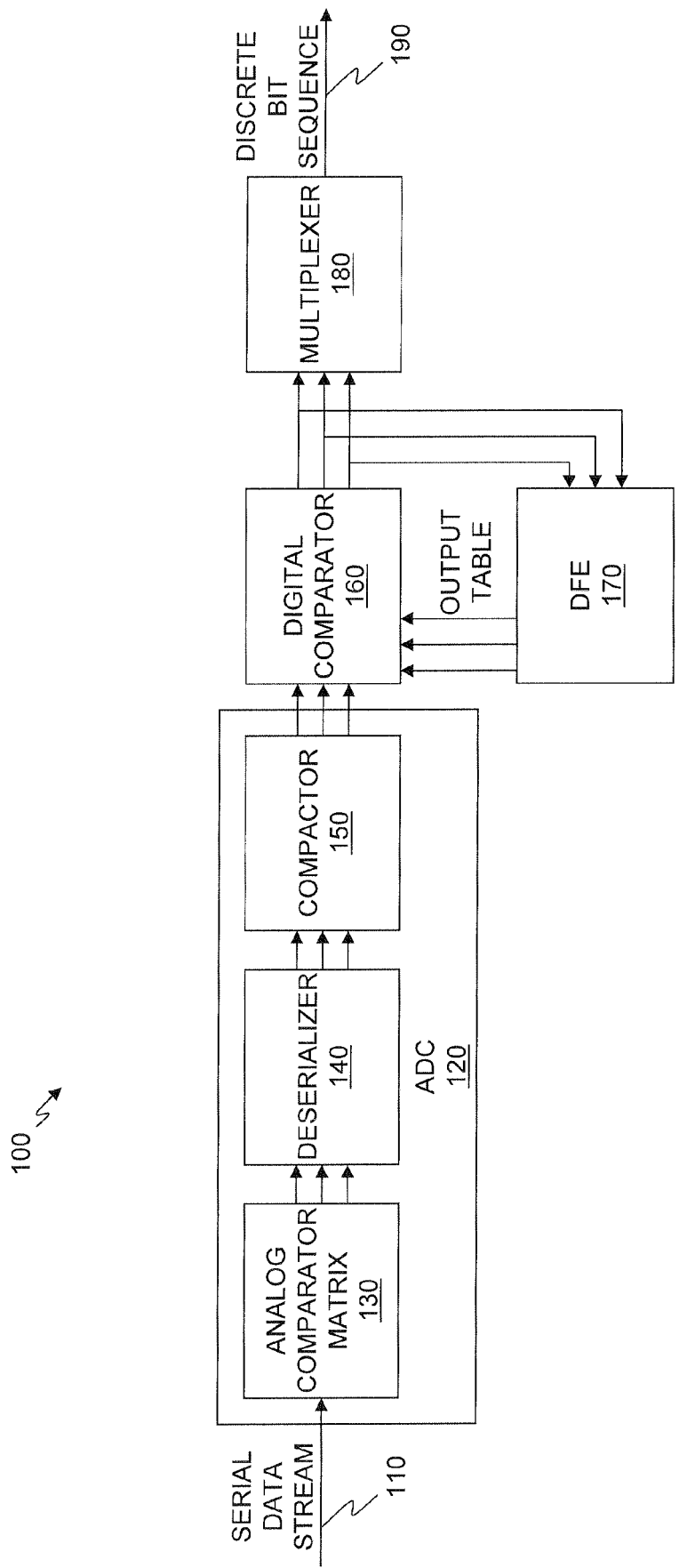
FIG. 1 is a block diagram of one embodiment of a SerDes constructed according to the principles of the invention.

FIG. 1 is a block diagram of one embodiment of a SerDes 100 constructed according to the principles of the invention. The stages in the SerDes 100 will now be described.

The SerDes 100 receives a serial data stream 110 into an analog-to-digital converter (ADC) 120. For purposes of this description, the salient parameters of the ADC 120 are is output number width, D, its interleaving width, $M_1$, and its deserialization width, $M_2$. $M=M_1 \cdot M_2$. $INP_t$ is the instantaneous value of the serial data stream 110 taken at a time t. The period of $INP_t$ is $\tau$. The maximum voltage of $INP_t$ is $V_{max}$, and the minimum voltage is 0.

The ADC 120 includes an analog comparator matrix 130. The analog comparator matrix 130 is configured to compare the voltage of the serial data stream 110 to various analog reference voltages. If the output of the analog comparator matrix 130 is clocked with a period $M_1 \cdot \tau$, the output of the analog comparator matrix 130 at the $t^{th}$ clock is:

$$ACMP_t(i,j), i=0, \ldots, 2^D-2, j=0, \ldots, M_1-1,$$

and $$ACMP_t(i,j), \begin{cases} 1 & \text{if } INP_{t \cdot M_1+j} > (i+1) \cdot V_{max} \cdot 2^{-D} \\ 0 & \text{otherwise} \end{cases}.$$

The output of the analog comparator matrix 130 is provided on a plurality of lines (defined as two or more but three being shown in FIG. 1 as one example) to a deserializer 140. The deserializer 140 is configured to deserialize the output of the analog comparator matrix 130. In one embodiment, the output of the deserializer 140 is clocked with a period $M_2 \cdot M_1 \cdot \tau$. The $t^{th}$ clock output is:

$$DSER_t(i,j)=ACMP_{t \cdot M_2+j//M_1}(i, j \% M_1) \; i=0, \ldots, 2^D-2,$$
$$j=0, \ldots, M_1 \cdot M_2-1.$$

The output of the deserializer 140 is provided on a plurality of lines to a compactor 150. The compactor 150 is configured to compact the output of the deserializer 140. The output of the compactor 150 is the ADC 120 output. In one embodiment, the same clock drives both the compactor 150 and the deserializer 140. If $T=M \cdot \tau=M_1 \cdot M_2 \cdot \tau$, the output at the $t^{th}$ clock is a vector of D-bit numbers:

$$ADCt(j) = \sum_{i=0}^{2^D-2} DSERt(i, j).$$

The output of the compactor 150 is the output of the ADC 120. The output of the ADC 120 is provided on a plurality of lines to a digital comparator 160. The digital comparator 160 is configured to compare the output of the ADC 120 to an output table to yield candidate output bits. In one embodiment, the same clock drives the digital comparator 160, the compactor 150 and the deserializer 140. For purposes of this description, the salient parameters of the digital comparator 160 are its output number width, D, and its number of taps, K. Again, $M=M_1 \cdot M_2$. K is assumed to be less than or equal to M.

A digital feedback equalizer (DFE) 170 provides the reference digital values to the digital comparator 160. The digital comparator 160 provides the candidate output bits as an input A to the DFE 170:

$$OUT_t(j), j=0, 1, \ldots, M-1.$$

In one embodiment, the same clock drives the DFE 170, the digital comparator 160, the compactor 150 and the deserializer 140. The DFE 170 has an internal register that is R[M−1:0] bits wide and corresponding output lines W[M−1:0] leading to the digital comparator 160. The current register value $R_t$ is therefore the output of the DFE 170 at the $t^{th}$ clock.

In the illustrated embodiment, the DFE 170 is configured to carry out the following functions:

$$R_0=0,$$

$$W_{t+1}[j]=MUX^K(S_{t+1}(j), A_{t+1}(j)), \text{ and}$$

$$R^{t+1}=W,$$

where $$A_t+1(j)=(DC_t(2^K-1, j), \ldots, DC_t(1, j), DC_t(0, j)), \text{ and}$$

$$S_{t+1}(j)[i] = \begin{cases} R_t[M-1+j-i] & \text{if } j \le i \\ W_{t+1}[j-i-1] & \text{otherwise} \end{cases},$$
$$j=0, 1, \ldots, M-1, \quad i=0, 1, \ldots, k-1.$$

As FIG. 1 shows, the DFE 170 provides an output table to the digital comparator 160:

$$EQT(i), i=0, 1, \ldots, 2^K-1.$$

In response, the outputs of the digital comparator 160 are:

$$DC_t(i,j)=(ADC_t(j)>EQT(i)), i=0, \ldots, 2^K-1, j=0, \ldots, M-1.$$

The digital comparator 160 also provides the candidate output bits to a multiplexer 180. The multiplexer 180 is configured to select output bits from among the candidate output bits. The output bits form a discrete bit sequence 190 that constitutes the output of the SerDes 100. In one embodiment, the same clock drives the multiplexer 180, the DFE 170, the digital comparator 160, the compactor 150 and the deserializer 140. In one embodiment, the multiplexer 180 is configured to carry out a function $MUX^P(S[P-1:0], A[2^P-1:0])$ as follows:

$$MUX^1(S[0:0], A[1:0])=S[0]-A[1]:A[0], \text{ and}$$

$$MUX^{P+1}(S[p:0], A[2^{p+1}-1:0])=S[p]-U_1:U_0,$$

where $$U_1=MUX^P(S[p-1:0], A[2^{p+1}-1:2^p]), \text{ and}$$

$$U_0=MUX^P(S[p-1:0], A[2^P-1:0]).$$

The circuit $MUX^P$ depth from port $S_i$ to output is (P−i). In the illustrated embodiment, this depth is important for timing.

All stages in the SerDes 100 except the DFE 170 may be pipelined. In the illustrated embodiment, $M_1$ is selected such a way that the deserializer 140 does not have timing problems. In one embodiment, deserialization is skipped ($M_2$=1) The DFE 170 contains a loop and so should be timed appropriately to avoid problems.

The depth of the path from $R_t[M-1-i]$ to $R_{t+1}[j]$ has a length (j+i+1) of cells in the multiplexer 180. The depth from $R_t[M-K+r]$ to $R_{t+1}[j]$ is:

$$j+((M-1)-(M-K+r))+1=j+K-r.$$

Assuming the clock for the $R_t[M-K+r]^{th}$ bit occurs later than the clock for $R[0:M-K]^{th}$ bit on $r \cdot \epsilon$, that $\mu$ represents the delay of the multiplexer 180 and that $\phi_s$ and $\phi_d$ are the setup and the delay for a flip-flop in the DFE 170, the arrival time from $R_t[M-K+r]$ to $R[j]$ is:

$$r \cdot \epsilon + \phi_d + (j+K-r) \cdot \mu.$$

The expected time for $R[j]$ is:

$$\begin{cases} M \cdot \tau - \phi_s & \text{if } j \leq M-K \\ M \cdot \tau + (j-(M-K)) \cdot \varepsilon - \phi_s & \text{otherwise} \end{cases}.$$

Let $j=(M-K)+J$, where $-(M-K) \leq J \leq K-1$. The arrival time may then be rewritten as follows:

$$r \cdot \epsilon + \phi_d + (j+M-r) \cdot \mu.$$

The expected time for $R[j]$ may likewise be rewritten:

$$\begin{cases} M \cdot \tau - \phi_s & \text{if } j \leq 0 \\ M \cdot \tau + (J \cdot \varepsilon - \phi_s & \text{otherwise} \end{cases}.$$

The following system of timing restrictions results:

$$\begin{cases} r \cdot \varepsilon + \phi_d + (J+M-r) \cdot \mu \leq M \cdot \tau - \phi_s & \text{if } J \leq 0 \\ r \cdot \varepsilon + \phi_d + (J+M-r) \cdot \mu \leq M \cdot \tau + J \cdot \varepsilon - \phi_s & \text{otherwise} \end{cases}.$$

If $\phi = \phi_d + \phi_s$, the following system of timing restrictions results:

$$\begin{cases} r \cdot \varepsilon + \phi_d + (J+M-r) \cdot \mu \leq M \cdot \tau & \text{if } J \leq 0 \\ r \cdot \varepsilon + \phi_d + (J+M-r) \cdot \mu - J \cdot \varepsilon \leq M \cdot \tau & \text{otherwise} \end{cases}.$$

If these timing restrictions are true for J=0, they are also true for J<0. Because the first and second equations of the timing restrictions are the same for J=0, only the second line of the system needs to be considered. Accordingly:

$$r \cdot \epsilon + \phi + (J+M-r) \cdot \mu - J \cdot \epsilon \leq M \cdot \tau, \ r=0, 1, \ldots, K-1, \ J=0, 1, \ldots, K-1, \text{ and:}$$

$$(J-r) \cdot (\mu - \epsilon) + \phi + M \cdot \mu \leq M \cdot \tau, \ r=0, 1, \ldots, K-1, \ J=0, 1, \ldots, K-1.$$

This system is equivalent to one equation:

$$(K-1) \cdot |\mu - \epsilon| + \phi + M \cdot \mu \leq M \cdot \tau.$$

If $\epsilon = \mu$, the following results:

$$\phi + M \cdot \mu \leq M \cdot \tau.$$

Alternatively:

$$r \geq \mu + \frac{\phi}{M}.$$

Figure 2:
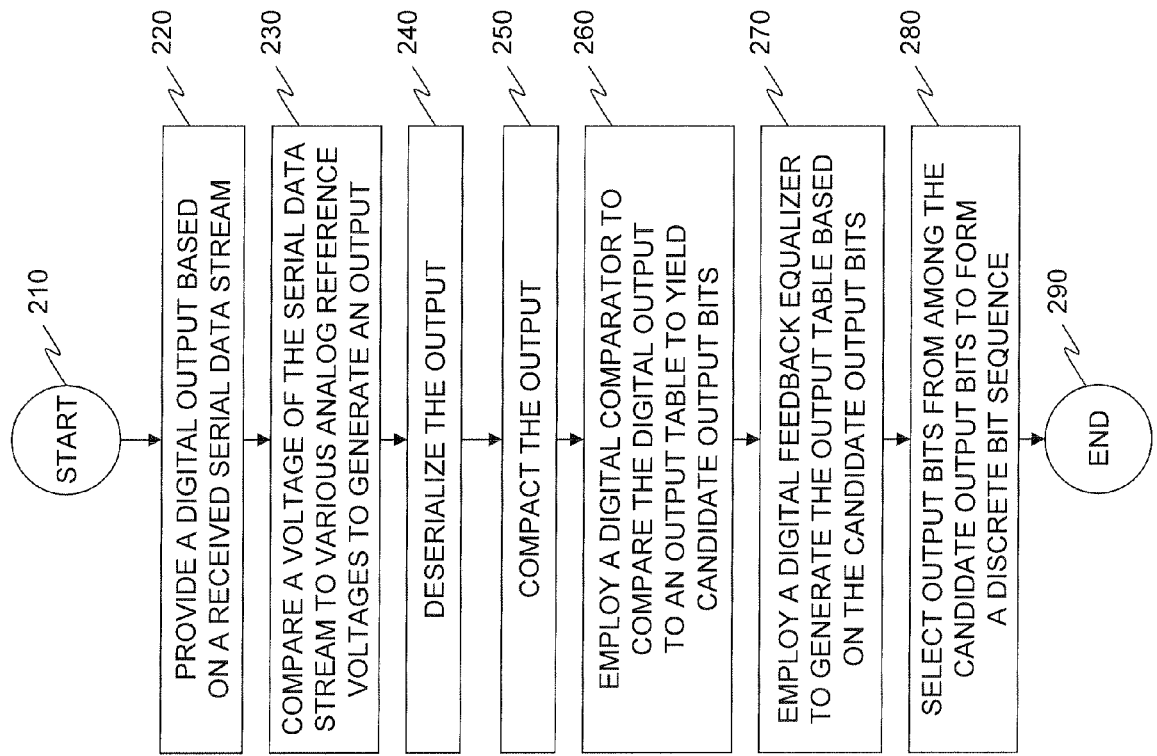
FIG. 2 is a flow diagram of one embodiment of a method of deserializing data carried out according to the principles of the invention.

FIG. 2 is a flow diagram of one embodiment of a method of deserializing data carried out according to the principles of the invention. The method begins in a start step 210. In a step 220, a digital output is provided based on a received serial data stream. In a step 230, a voltage of the serial data stream is compared to various analog reference voltages to generate an output. In a step 240, the output resulting from the step 230 is deserialized. In a step 250, the output resulting from the step 240 is compacted to yield the digital output. In a step 260, a digital comparator is employed to compare the digital output to an output table to yield candidate output bits. In a step 270, a digital feedback equalizer is employed to generate the output table based on the candidate output bits. In a step 280, output bits are selected from among the candidate output bits to form a discrete bit sequence. The method ends in an end step 290.

Those skilled in the art to which the invention relates will appreciate that other and further additions, deletions, substitutions and modifications may be made to the described embodiments without departing from the scope of the invention.

What is claimed is:

1. A serializer-deserializer, comprising:
    an analog-to-digital converter configured to receive a serial data stream and provide a digital output based thereon;
    a digital comparator coupled to said analog-to-digital converter and configured to compare said digital output to an output table to yield candidate output bits;
    a digital feedback equalizer coupled to said digital comparator and configured to generate said output table based on said candidate output bits; and
    a multiplexer coupled to said digital comparator and configured to select output bits from among said candidate output bits to form a discrete bit sequence.

2. The serializer-deserializer as recited in claim 1 wherein said analog-to-digital converter includes:
    an analog comparator matrix configured to compare a voltage of said serial data stream to various analog reference voltages;
    a deserializer coupled to said analog comparator matrix and configured to deserialize an output thereof; and
    a compactor coupled to said deserializer and configured to compact an output thereof.

3. The serializer-deserializer as recited in claim 1 wherein said candidate output bits are generated in accordance with $DC_t(i,j) = (ADC_t(i) > EQT(i))$, $i=0, \ldots, 2^K-1$, $j=0, \ldots, M-1$.

4. The serializer-deserializer as recited in claim 1 wherein said digital feedback equalizer is configured to carry out the following functions:

$$R_0 = 0,$$

$$W_{t+1}[j] = \text{MUX}^K(S_{t+1}(j), A_{t+1}(j)), \text{ and}$$

$$R^{t+1} = W.$$

where $A_t+1(j)=(DC_t(2^K-1,j), \ldots, DC_t(1,j), DC_t(0,j))$, and $$S_{t+1}(j)[i] = \begin{cases} R_t[M-1+j-i] & \text{if } j \le i \\ W_{t+1}[j-i-1] & \text{otherwise} \end{cases},$$

$$j = 0, 1, \ldots, M-1, \quad i = 0, 1, \ldots, K-1.$$

5. The serializer-deserializer as recited in claim 1 wherein said multiplexer is configured to carry out a function $\text{MUX}^P(S[P-1:0], A[2^P-1:0])$ as follows:

$\text{MUX}^1(S[0:0], A[1:0]) = S[0] \cdot A[1]:A[0]$, and $\text{MUX}^{P+1}(S[p:0], A[2^{p+1}-1:0]) = S[p] \cdot U_1:U_0$, where $U_1 = \text{MUX}^P(S[p-1:0], A[2^{p+1}-1:2^p])$, and $U_0 = \text{MUX}^P(S[p-1:0], A[2^p-1:0])$.

6. The serializer-deserializer as recited in claim 1 wherein said serializer-deserializer operates subject to a timing restriction of:

$$r \ge \mu + \frac{\phi}{M}.$$

7. The serializer-deserializer as recited in claim 1 wherein said analog-to-digital converter, said digital comparator and said multiplexer are pipelined.

8. A method of deserializing data, comprising:
providing a digital output based on a received serial data stream;
employing a digital comparator to compare said digital output to an output table to yield candidate output bits;
employing a digital feedback equalizer to generate said output table based on said candidate output bits; and
selecting output bits from among said candidate output bits to form a discrete bit sequence.

9. The method as recited in claim 8 wherein said providing includes:
comparing a voltage of said serial data stream to various analog reference voltages to generate an output;
deserializing said output; and
compacting said output.

10. The method as recited in claim 8 wherein said candidate output bits are generated in accordance with $DC_t(i,j) = (ADC_t(j) > EQT(i))$, $i=0, \ldots, 2^K-1$, $j=0, \ldots, M-1$.

11. The method as recited in claim 8 wherein said employing said digital feedback equalizer comprises carrying out the following functions:

$R_0 = 0$, $W_{t+1}[j] = \text{MUX}^K(S_{t+1}(j), A_{t+1}(j))$, and $R^{t+1} = W_t$, where $A_t+1(j)=(DC_t(2^K-1,j), \ldots, DC_t(1,j), DC_t(0,j))$, and $$S_{t+1}(j)[i] = \begin{cases} R_t[M-1+j-i] & \text{if } j \le i \\ W_{t+1}[j-i-1] & \text{otherwise} \end{cases},$$

$$j = 0, 1, \ldots, M-1, \quad i = 0, 1, \ldots, K-1.$$

12. The method as recited in claim 8 wherein said selecting comprises carrying out a function $\text{MUX}^P(S[P-1:0], A[2^P-1:0])$ as follows:

$\text{MUX}^1(S[0:0], A[1:0]) = S[0] \cdot A[1]:A[0]$, and $\text{MUX}^{P+1}(S[p:0], A[2^{p+1}-1:0]) = S[p] \cdot U_1:U_0$, where $U_1 = \text{MUX}^P(S[p-1:0], A[2^{p+1}-1:2^p])$, and $U_0 = \text{MUX}^P(S[p-1:0], A[2^p-1:0])$.

13. The method as recited in claim 8 wherein said method is carried out subject to a timing restriction of:

$$r \ge \mu + \frac{\phi}{M}.$$

14. The method as recited in claim 8 wherein said providing, said employing said digital comparator and said selecting are carried out in a pipeline.

15. A serializer-deserializer, comprising:
an analog-to-digital converter configured to receive a serial data stream and provide a digital output based thereon and including:
an analog comparator matrix configured to compare a voltage of said serial data stream to various analog reference voltages,
a deserializer coupled to said analog comparator matrix and configured to deserialize an output thereof, and
a compactor coupled to said deserializer and configured to compact an output thereof;
a digital comparator pipelined with said analog-to-digital converter and configured to compare said digital output to an output table to yield candidate output bits;
a digital feedback equalizer coupled to said digital comparator and configured to generate said output table based on said candidate output bits; and
a multiplexer pipelined with said digital comparator and configured to select output bits from among said candidate output bits to form a discrete bit sequence.

16. The serializer-deserializer as recited in claim 15 wherein said candidate output bits are generated in accordance with $DC_t(i,j) = (ADC_t(j) > EQT(i))$, $i=0, \ldots, 2^K-1$, $j=0, \ldots, M-1$.

17. The serializer-deserializer as recited in claim 15 wherein said digital feedback equalizer is configured to carry out the following functions:

$R_0 = 0$, $W_{t+1}[j] = \text{MUX}^K(S_{t+1}(j), A_{t+1}(j))$, and $R^{t+1} = W_t$, where $A_t+1(j) = (DC_t(2^K-1,j), \ldots, DC_t(1,j), DC_t(0,j))$, and $$S_{t+1}(j)[i] = \begin{cases} R_t[M-1+j-i] & \text{if } j \leq i \\ W_{t+1}[j-i-1] & \text{otherwise} \end{cases},$$

$j = 0, 1, \ldots, M-1, \quad i = 0, 1, \ldots, K-1.$

18. The serializer-deserializer as recited in claim 15 wherein said multiplexer is configured to carry out a function $MUX^P(S[P-1:0],A[2^P-1:0])$ as follows:

$MUX^1(S[0:0],A[1:0]) = S[0] - A[1]:A[0]$, and $MUX^{P+1}(S[p:0],A[2^{P+1}-1:0]) = S[p] - U_1:U_0$, where $U_1 = MUX^P(S[p-1:0],A[2^{P+1}-1:2^P])$, and $U_0 = MUX^P(S[p-1:0],A[2^P-1:0])$.

19. The serializer-deserializer as recited in claim 15 wherein said serializer-deserializer operates subject to a timing restriction of:

$$r \geq \mu + \frac{\phi}{M}.$$

* * * * *